Sept. 21, 1965 W. H. LEAVITT, JR., ETAL 3,207,128

APPARATUS FOR COATING ELECTRICAL ARTICLES

Filed April 27, 1962 2 Sheets-Sheet 1

INVENTORS
W. H. LEAVITT JR.
D. T. McHALE
E. T. STOCKER

By [signature]
ATTORNEY

Sept. 21, 1965 W. H. LEAVITT, JR., ETAL 3,207,128

APPARATUS FOR COATING ELECTRICAL ARTICLES

Filed April 27, 1962 2 Sheets-Sheet 2

INVENTORS
W. H. LEAVITT JR.
D. T. McHALE
E. T. STOCKER

BY W. A. Johnson
ATTORNEY

United States Patent Office 3,207,128

Patented Sept. 21, 1965

3,207,128

APPARATUS FOR COATING ELECTRICAL ARTICLES

William H. Leavitt, Jr., Haverhill, David T. McHale, North Andover, and Edward T. Stocker, Groveland, Mass., assignors to Western Electric Company, Incorporated, New York, N.Y., a corporation of New York

Filed Apr. 27, 1962, Ser. No. 190,732
5 Claims. (Cl. 118—602)

This invention relates to apparatus for coating electrical articles, and more particularly to coating the electrical circuits of wiring boards with solder.

The coating of electrical circuits of wiring boards with solder necessitates a rather large supply of molten solder, and the movement of quantities of molten solder to the surfaces of the wiring boards on which the circuits are mounted, to thoroughly and satisfactorily coat the various parts of the circuit. Troublesome factors associated with the solder coating of electrical circuits are the formation of slag on a supply of molten solder, and the thickness and smoothness of the solder coating particularly in areas where eyelets are to be inserted.

An object of the invention is the provision of apparatus for efficiently coating electrical circuits of wiring boards and maintaining a supply of solder required for this purpose substantially free of foreign particles.

With these and other objects in view, an apparatus for coating electric circuits on wiring boards, illustrating certain features of the invention, includes an open top heated tank having a supply of molten solder therein which has a layer of wax thereon. A closed system for causing a flow of a solder stream in a prescribed path is mounted in the tank, includes a compartment having walls extending above level of wax, a diffusion chamber mounted in the compartment, a platform disposed above the wax in a first horizonal plane at the top of the compartment, and a pair of parallel walls which form a guided path for the solder stream from the chamber to the platform, the depth of the solder flowing over the platform being determined by the spacing between the parallel walls. The apparatus also includes facilities for guiding the electrical circuits of the wiring boards through the stream of solder and for circulating the molten solder.

Other and objects and advantages will be apparent from the following detailed description when considered in conjunction with the accompanying drawing in which.

Figure 2:
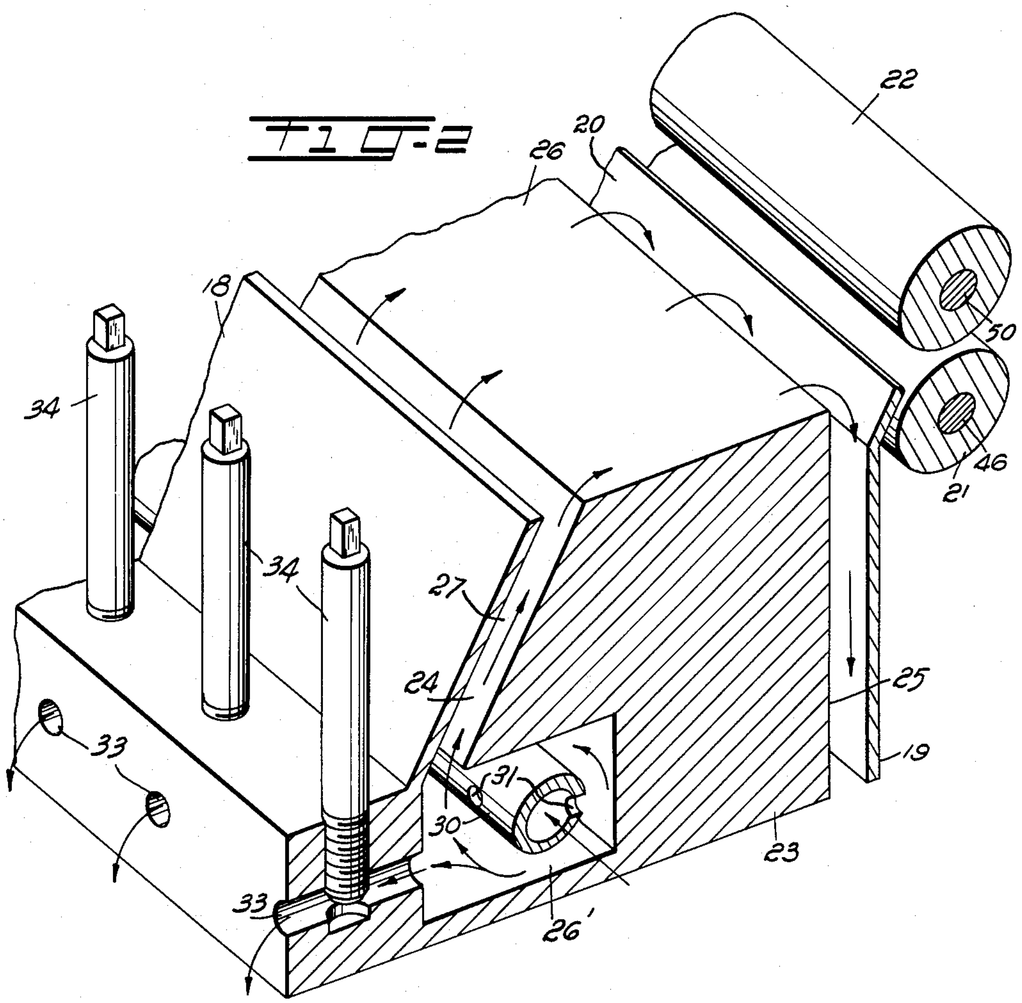
FIG. 2 is a fragmentary sectional view illustrating the path for the stream of solder and, FIG. 3 is a fragmentary sectional view of a wiring board.

The apparatus includes an open top heated tank 10 having a supply of solder 11, the tank being heated in any desired conventional manner, for example, through the aid of heating coils (not shown) having an inlet 12 and an outlet 14. A stream controlling unit is mounted in the tank and provided with end walls 16 and 17 connected to a front wall 18 and a back wall 19. As best seen in FIG. 2, the back wall 19 has an upper end 20 leading toward the meeting line between a lower roller 21 and an upper roller 22. An inner member 23, for the stream control unit, is interposed between the end walls 16 and 17 and fixed thereto. This inner member 23 includes a front surface 24 parallel with the front wall 18, a back surface 25 parallel with the back wall 19 and a top surface or platform 26.

In this structure (FIG. 2) a diffusion chamber 26' receives a controlled flow of solder directed in a stream 27 equal in width to the distance between the end members 16 and 17 and a predetermined depth. Stream 27 moves through a pasageway between wall 18 and surface 24, over the top member 26, and through the passageway between wall 19 and surface 25. Also, the upper surface of the stream will be of a given depth and in a given plane.

A fluid pump 28 (FIG. 1) driven by a motor 29 is connected to a pipe 30 disposed in the chamber 26', pipe 30 being provided with a plurality of apertures 31 extending into the diffusion chamber at the entrance end of the passageway for the stream of solder 27 between the front wall 18 and surface 24. In this manner, the molten solder for the stream 27 may be removed from the supply 11 beneath the upper surface 32 thereof and be forced through the guided area over the platform 26 at a predetermined level. The solder which has not been deposited on the electrical circuits of the wiring board passing over platform 26 will be returned to the supply between the back wall 19 and surface 25. A plurality of passageway 33 extend from the diffusion chamber 26' to the supply 11 and solder leveling valves 34 extend adjustable distances into these passageway to condition them as by-pass valves to control the flow of solder through the guided area as shown particularly in FIG. 2. A similar by-pass valve 35 (FIG. 1) is provided for the pump 28. Furthermore, a level controlling unit 36 having an air vent 37 is adapted to allow excess solder in the supply 11 to flow into a tank 38.

Figure 1:
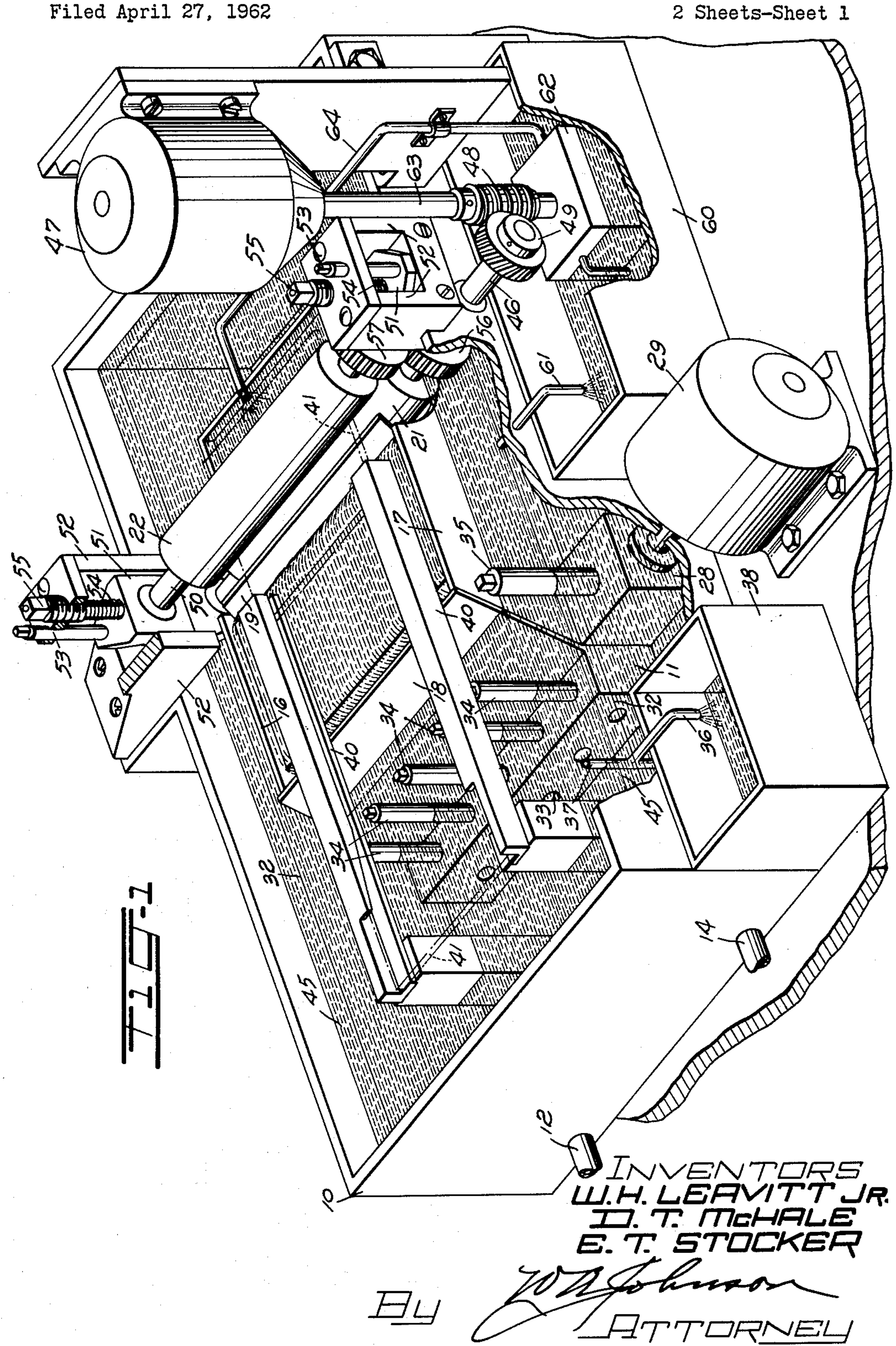
FIG. 1 is an isometric view of the apparatus.
Figure 3:
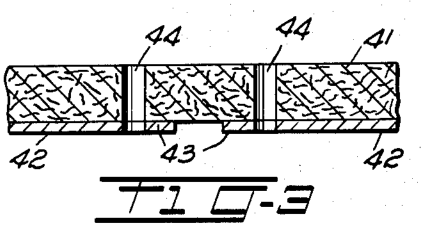

With reference to FIG. 1, suitable guides 40 are adapted to receive wiring boards 41 (FIG. 3) successively and guide the wiring boards over the top of the tank. The under surfaces of boards 41, which carry electrical circuits 42 that terminate at land area 43 adjacent apertures 44 in a plane substantially adjacent to or slightly beneath the plane of the upper surface of the stream 27 of solder, move over the platform 26 (FIG. 2) and in the same direction as the flow of the stream 27 of solder.

Similar guides may be provided for the wiring boards after passing between the rollers 21 and 22 but such guides have been eliminated to clearly illustrate other portions of the apparatus.

A layer of molten wax 45 is placed on the supply 11 of molten solder to cover the supply of solder and seal it against exposure to air. The stream controlling unit, however, extends from within the supply of solder 11 as shown in FIG. 1 through the layer of molten wax so that a stream of solder may be caused to flow continuously to the platform 26 and contact with the wiring boards without coming in contact with the layer of molten wax. The roller 21 is a highly polished stainless steel roller mounted on a shaft 46 so that it will extend downwardly into the layer 45 of molten wax and be covered constantly with the molten wax. The shaft 46 is driven by a motor 47 through a worm 48 and a worm gear 49 in a direction to cause the rollers to continue the advancement of the wiring boards. The upper roller 22 is mounted on a shaft 50, the ends of which are journaled in bearing members 51 positioned between vertical guides 52, assisted by vertical rods 53 and urged downwardly by springs 54, the forces of which may be varied by adjustable screws 55. The rollers 21 and 22 are operatively connected to each other by spur gears 56 and 57. The roller 21 has its axis fixed while the axis of the roller 22 may be moved vertically permitting the roller 22 to ride on the roller 21 to pick up molten wax therefrom but movable vertically to allow the successive wiring boards to move between the rollers. An overflow tank 60 for the molten wax is fed by a level control member 61 while a pump 62 driven by a shaft 63 of the motor 47 continuously adds molten wax to the tank 10 through a supply line 64.

*Operation*

When the apparatus is in operation, the supply of solder 11 is in a molten state and with the layer of wax 45 thereon the wax remains molten to completely cover the supply of solder and to coat the roller 21 with wax, which in turn, will coat the roller 22 to prevent the collection of solder particles on the rollers. The layer of molten wax serves several purposes; the first, covering and sealing the supply of solder with the exception of limited flow through the guiding unit; second, keeping the rollers 21 and 22 free of the accumulation of solder thereon as excess solder is squeezed from the wiring boards; and third, providing a means of cleaning excess solder squeezed from wiring boards as these excess quantities of solder drop back into the solder supply 11 through the layer 45 of molten wax. Therefore, the function of the rollers, in addition to advancing the wiring boards as they move from the stream of solder, is to squeeze excess quantities of solder from beneath the wiring boards, thereby controlling the solder thickness through pressure variation to bring about more efficient soldering of the electrical components to the circuits of the wiring boards. As a result, the control lead thickness of the solder coating is created as the wiring boards move between the rollers, this being made possible through the continuous cleansing of the rollers by the coatings of molten wax thereon, eliminating the possibility of collecting particles of solder on the rollers.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. An apparatus for coating electrical circuits of wiring boards with solder, comprising:
   an open top heated tank supplied with molten solder to a given level,
   means for maintaining a layer of molten wax on top of the solder,
   a closed system for causing a flow of a solder stream, the system including
      a compartment, greater in width than the wiring boards and mounted in the tank, and having perimeter walls which extend above the level of wax,
      a diffusion chamber contained within the compartment and having an outlet extending substantially the full width of the compartment,
      a platform extending substantially the full width of the compartment and disposed above the layer of wax in a first horizontal plane,
      a wall parallel to the front perimeter wall of the compartment, the pair of parallel walls forming a guided path for the solder stream from the outlet of the chamber to the platform, the solder stream being of a width substantially equal to the width of the platform, the depth of the solder stream flowing over the platform being determined in part by the spacing between the parallel walls, and
      means for returning the solder which leaves the platform to the molten solder in the tank,
   means disposed in the open top of the tank for guiding the wiring boards in a given direction and in a second horizontal plane above the layer of molten wax, such that the electrical circuits pass through the solder stream, and
   means mounted in the tank and extending into the diffusion chamber for circulating a predetermined quantity of the molten solder from the tank into the chamber during a given interval of time.

2. An apparatus for coating electrical circuits of wiring boards with solder according to claim 1, further comprising:
   means for varying the speed of movement of the stream of solder in the guided path to vary the depth of the stream relative to the second horizontal plane when flowing over the platform.

3. An apparatus for coating circuits of wiring boards with solder according to claim 1, further comprising:
   means for varying the speed of movement of the stream of solder in the guided path to vary the depth of the stream relative to the second horizontal plane when flowing over the platform; said speed varying means including passageways extending from the diffusion chamber to the tank externally of the compartment, and valves for the passageways movable from closed positions to variable open positions so that varied quantities of solder may be bypassed through the passageways when the valves are open.

4. An apparatus for coating electrical circuits of wiring boards with solder according to claim 1, further comprising:
   means for varying the speed of movement of the stream of solder in the guided path to vary the depth of the stream relative to the second horizontal plane when flowing over the platform, and
   in which the means for returning the solder comprises a wall parallel to the rear perimeter wall of the compartment, the pair of walls forming a guided path to receive the stream of solder leaving the platform and direct it to the molten solder in the tank beneath the layer of wax.

5. An apparatus for coating electrical circuits of wiring boards with solder according to claim 1, further comprising:
   means for varying the speed of movement of the stream of solder in the guided path to vary the depth of the stream relative to the second horizontal plane when flowing over the platform,
   first and second driven rollers positioned to receive the wiring boards leaving the stream of solder to squeeze excess solder from the circuits of the boards,
   means to rotatably support the first roller on a fixed axis in the tank so that a portion thereof below its axis will extend into the layer of molten wax to keep the entire surface of the first roller coated with a layer of wax sufficient to eliminate the collection of molten solder thereon, and
   means to support the second roller on a movable axis so that at intervals it may engage the first roller and repeatedly receive a coating of molten wax to eliminate the collection of molten solder thereon.

References Cited by the Examiner

UNITED STATES PATENTS

| | | | |
|---|---|---|---|
| 1,258,322 | 3/18 | Doellinger | 118—24 X |
| 2,227,976 | 1/41 | McLin | 118—117 |
| 2,993,272 | 7/61 | Carlzen et al. | 113—126 X |
| 3,004,505 | 10/61 | Dvorak | 118—410 X |
| 3,037,274 | 6/62 | Hancock | 113—126 X |
| 3,039,185 | 6/62 | Oates | 113—126 X |
| 3,058,441 | 10/62 | Walker | 118—410 X |
| 3,081,535 | 3/63 | Lincoln | 118—410 X |
| 3,092,059 | 6/63 | Tesch | 113—126 |
| 3,119,363 | 1/64 | Rieben | 118—410 X |

FOREIGN PATENTS 738,874 10/55 Great Britain.

CHARLES A. WILLMUTH, *Primary Examiner.*

RICHARD D. NEVIUS, WILLIAM D. MARTIN, *Examiners.*